(12) United States Patent
Chacinski et al.

(10) Patent No.: US 10,141,715 B2
(45) Date of Patent: Nov. 27, 2018

(54) APPARATUS FOR DAMPING AND MONITORING EMISSIONS FROM LIGHT EMITTING DEVICES

(71) Applicant: Finisar Corporation, Sunnyvale, CA (US)

(72) Inventors: Marek Grzegorz Chacinski, Farsta (SE); Nicolae Pantazi Chitica, Kista (SE); Hans Magnus Emil Andersson, Jaerfaella (SE); Lennart Per Olof Lundqvist, Jaerfaella (SE); Andrei Kaikkonen, Jaerfaella (SE)

(73) Assignee: Finisar Corporation, Sunnyvale, CA (US)

( * ) Notice: Subject to any disclaimer, the term of this patent is extended or adjusted under 35 U.S.C. 154(b) by 6 days.

(21) Appl. No.: 15/411,828

(22) Filed: Jan. 20, 2017

(65) Prior Publication Data

US 2017/0264077 A1    Sep. 14, 2017

(30) Foreign Application Priority Data

Nov. 20, 2015 (EP) ..................................... 15195655

(51) Int. Cl.
*H01S 5/026* (2006.01)
*H01S 5/022* (2006.01)
*H01S 5/42* (2006.01)
*H01S 5/042* (2006.01)
*H01S 5/06* (2006.01)
(Continued)

(52) U.S. Cl.
CPC ............ *H01S 5/026* (2013.01); *H01L 31/095* (2013.01); *H01L 31/162* (2013.01); *H01S 5/02248* (2013.01); *H01S 5/02296* (2013.01); *H01S 5/0425* (2013.01); *H01S 5/0609* (2013.01);
(Continued)

(58) Field of Classification Search
CPC .... H01S 5/026; H01S 5/02248; H01S 5/0609; H01S 5/0425; H01S 5/423
See application file for complete search history.

(56) References Cited

U.S. PATENT DOCUMENTS 5,141,308 A * 8/1992 Danckwerth ......... G01S 17/102
356/5.05
5,606,572 A * 2/1997 Swirhun ................ B82Y 20/00
257/84

(Continued)

FOREIGN PATENT DOCUMENTS

EP    0899836 A1    3/1999

*Primary Examiner* — Yuanda Zhang
(74) *Attorney, Agent, or Firm* — Maschoff Brennan

(57) ABSTRACT

The present invention relates to an apparatus for damping arid monitoring emissions from a light emitting device, particularly a vertical cavity surface emitting laser (VCSEL), comprising: a semi transparent substrate, preferably glass; a light emitting device for generating light emission; a damping layer deposited on a surface of the substrate; and a pair of electrodes, each of which being in direct contact with the damping layer. The damping layer is adapted to decrease the power level of the light emission of the light emitting device by absorption, to a desired level, for instance, to a level that meets eye safety limits. In addition, the damping layer is photosensitive to the light emission of the light emitting device, thereby allowing the pair of electrodes to output an electric signal corresponding to the power level of the light emission of the light emitting device.

20 Claims, 4 Drawing Sheets

(51) Int. Cl.
*H01L 31/09* (2006.01)
*H01L 31/16* (2006.01)
*H01S 5/00* (2006.01)
*H01S 5/0683* (2006.01)
*H01S 5/183* (2006.01)

(52) U.S. Cl.
CPC .............. *H01S 5/423* (2013.01); *H01S 5/005* (2013.01); *H01S 5/0683* (2013.01); *H01S 5/183* (2013.01)

(56) References Cited

U.S. PATENT DOCUMENTS

| | | | |
|---|---|---|---|
| 6,037,644 | A * | 3/2000 | Daghighian ........ H01L 31/1016 257/431 |
| 6,879,014 | B2 | 4/2005 | Sigurd et al. |
| 2003/0057355 | A1 | 3/2003 | Cheng-Bin |
| 2014/0255042 | A1* | 9/2014 | Kaikkonen ............ H04B 10/40 398/136 |

* cited by examiner ions from light emitting devices

BACKGROUND

The present invention relates to an apparatus for damping and monitoring emissions from a laser diode, particularly, from a vertical cavity surface emitting laser (VCSEL). Also, the present invention relates to an opto-electrical assembly (optical engine) including the apparatus for damping and monitoring emissions from a laser diode.

In order to support the communication requirements of high-speed data transmission applications, optical links are used when links via an electrical wire have a too low bandwidth. When using an optical link for transmitting a signal from a first electronic component to a second electronic component, the electric signal to be transmitted is first converted into an optical signal, then the optical signal is coupled into an optical fiber via an optical transmitter and transmitted to the second electronic component via the optical fiber. On the other hand, when the first electronic component uses an optical link for receiving an optical signal from the second electronic component, the first electronic component converts the received optical signal into an electrical signal before further processing.

FIG. 1 shows an opto-electrical assembly (also denoted as optical engine) for converting an electric signal into an optical signal and vice-versa. The optical engine 100 includes an optical carrier 101, an array of four laser diodes 103 (for instance, vertical cavity surface emitting lasers, abbreviated VCSEL), a driver IC 102 including an array of four drivers for driving the four laser diodes 103, an array of four photodiodes 104, and an integrated circuit (IC) including an array of four transimpedance amplifiers 105 (abbreviated TIAs) for amplifying the output signals of the four photodiodes 104. The driver IC 102, the array of laser diodes 103, the array of photodiodes 104 and the IC including the TIAs 105 are all mounted on the optical carrier 101. The optical carrier 101 essentially includes a glass substrate which is transparent for the light/laser emission of the optical signals.

Each driver of the driver array 102 receives at its input terminals 106 an electric signal, converts the received electrical signal into an electric driver signal for driving a respective laser diode of the array of laser diodes 103. Each laser diode of the array of laser diodes 103 converts the driving signal received at its inputs to an optical signal, which is output to, for instance, an optical fiber (not shown in FIG. 1). Each photodiode of the array of photodiodes 104 receives an optical signal from, for instance an optical fiber, converts the received optical signal into an electrical signal, and outputs this to the inputs of a respective TIA of the array of TIAs 105.

When using laser diodes for converting electrical signals into optical signals, the optical engine 100 has to meet standard eye safety regulations to avoid eye damage to an operator/user. Therefore, the output power of each optical signal which leaves the optical engine 100 must not exceed eye safety limits. The power level of laser emissions output by vertical cavity surface emitting lasers (VCSELs) normally exceeds the eye safety limits. Therefore, damping/limiting/attenuating of the laser emissions output by VCSELs is required. In order to damp the optical power of the laser emission leaving the optical engine 100, for instance, towards an optical fiber, a damping layer is used in known optical engines. This damping layer is interposed in the optical path of the laser emissions of the VCSELs. Typically, the damping layer is deposited on a surface of the glass substrate and integrated in the optical carrier 101. The damping layer also reduces optical reflections toward VCSEL Furthermore, in fiber optic communication systems a nearly constant output power of the VCSELs is desired. However, during operation, ambient temperature changes and aging of the device can result in fluctuations in the output power of the VCSELs. Therefore, monitoring of the output power of the VCSELs is advantageous.

To this end, document U.S. Pat. No. 6,037,644 discloses an apparatus for monitoring emissions from VCSELs. FIG. 2 shows a cross sectional view of this apparatus. It comprises: a glass substrate 137, an amorphous silicon layer 136 on the glass substrate 137, a separate substrate 131 having selected areas being provided with the VCSELs 132, and a flex circuit layer 134 interposed between the amorphous silicon layer 136 and the separate substrate 131. The amorphous silicon layer 136 has selectively doped areas that provide PN junctions 139 of photovoltaic devices and a sufficiently small optical absorption coefficient, within an optical wavelength range, that limits absorption of a corresponding small fractional amount of light being emitted by the VCSELs 132. The amorphous silicon layer 136 and the glass substrate 137 are sufficiently thin to be transmissive of such light therethrough, excluding the small fractional amount of such light being absorbed by the photovoltaic devices. The photovoltaic devices are on top of the VCSELs. The VCSELs 132 are further constructed and arranged to emit such light having a wavelength range that corresponds to the wavelength range at which the amorphous silicon layer 136 has the sufficiently small absorption coefficient, whereby, a substantial portion of such light is transmitted through the photovoltaic devices, and a small fraction of such light is absorbed by the doped areas 139 of the amorphous silicon layer 136 to produce photovoltaic currents from the photovoltaic devices as a measurement of output power of the VCSELs 132. The flex circuit layer 134 is transparent and Includes on its upper and lower surface areas of semitransparent contact metallization 135. The amorphous silicon layer 136 has semitransparent contact metallization areas 140 being in contact with areas of semitransparent contact metallization 135 of the upper surface of the transparent flex circuit layer 134; and the separate substrate 131 has respective semitransparent contact metallization areas 132 being in contact with the areas of semitransparent contact metallization 135 of the lower surface of the flex circuit layer 140.

The apparatus for monitoring laser emissions from VCSELs shown in FIG. 2 requires PN junctions 139 (i.e. photodiodes) for monitoring the output power of the VCSELs 132. However, implementing these PN junctions complicates the manufacturing process of the apparatus and consequently enhances its manufacturing costs. Also, the structure shown in FIG. 2 requires the flex circuit layer 134 for providing electrical contacts to the VCSELs 132 and the photodiodes 139, which further enhances the manufacturing costs.

SUMMARY OF INVENTION

It is, therefore, an objective of the present invention to provide for an apparatus for damping and monitoring emissions from a laser diode, particularly a VCSEL, which assures that the power of the laser emission that leaves/exits the apparatus meets eye safety limits, and provides a structure for monitoring the output power of the laser emission, which can be easily and cost-effectively manufactured.

It is a further objective of the present invention to provide for an opto-electrical assembly (optical engine), which assures that the power of the laser emission that leaves/exits the opto-electrical assembly meets eye safety limits, enables monitoring the output power of this laser emission, and can be easily and cost-effectively manufactured.

The present invention is based on the idea to deposit a photosensitive damping layer on the glass substrate of the apparatus, to contact the photosensitive damping layer with a pair of electrodes, and to adapt this pair of electrodes so as to output an electric signal in accordance with the power level of the laser emission of the laser diode.

The apparatus according to the present invention needs no photodiode for monitoring the output power of the laser emission. Therefore, its manufacturing process is simplified and cost-effective.

DETAILED DESCRIPTION

Reference will be made to the drawings and specific language will be used to describe various aspects of the disclosure. Using the drawings and description in this manner should not be construed as limiting its scope. Additional aspects may be apparent in light of the disclosure, including the claims, or may be learned by practice.

Figure 1:
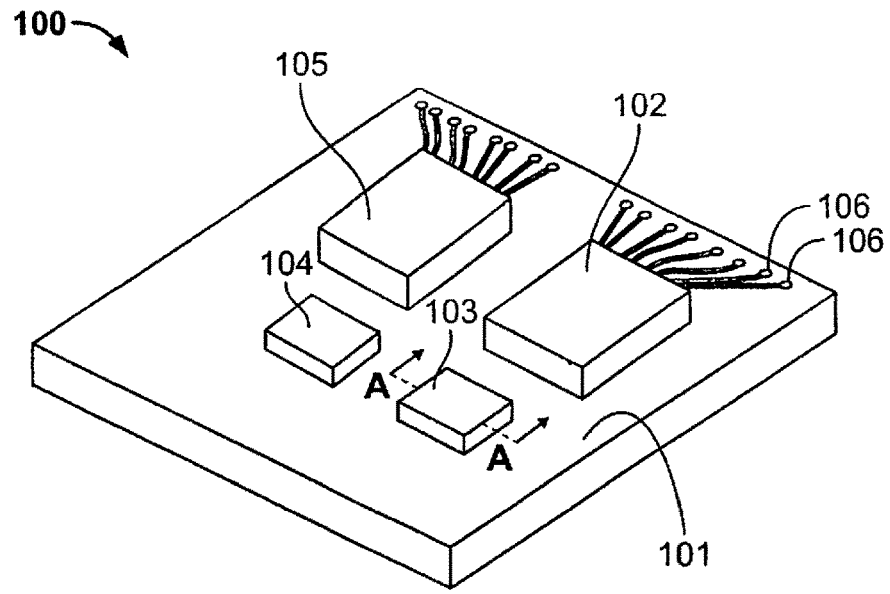
FIG. 1 shows a perspective view of an opto-electrical assembly (optical engine)
Figure 2:
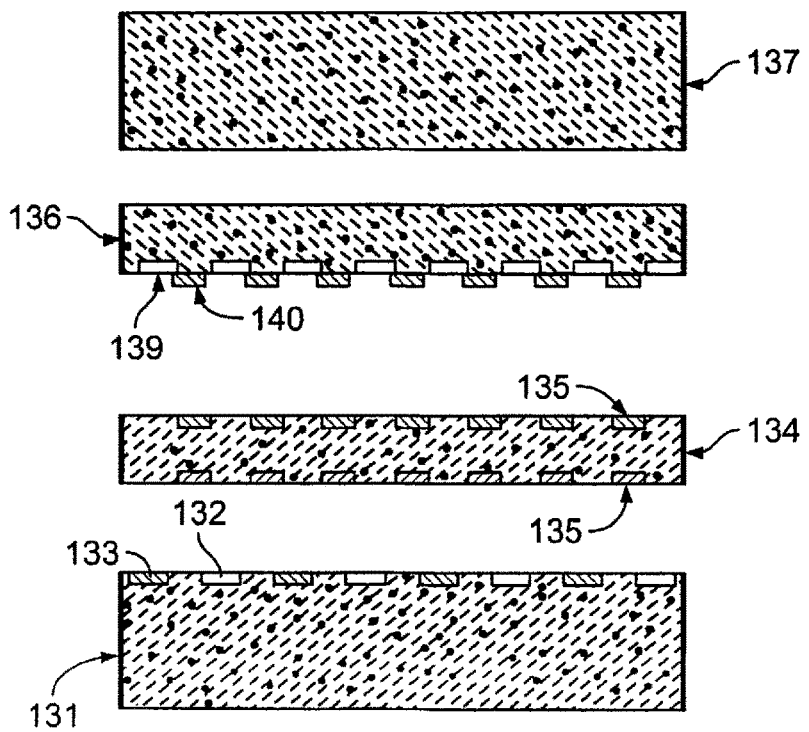
FIG. 2 shows a cross sectional view of an apparatus for monitoring emissions from vertical cavity surface emitting lasers according to the prior art.
Figure 3:
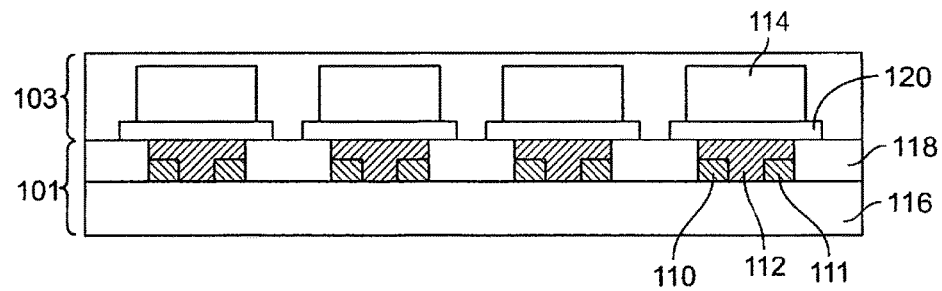
FIG. 3 shows a cross sectional view of an apparatus for damping and monitoring emissions from vertical cavity surface emitting lasers (VCSEL) according to a first embodiment of the present invention, at section A-A in FIG. 1.

FIG. 3 shows a cross-sectional view of an opto-electrical assembly according to the present invention, at section A-A indicated in FIG. 1. The opto-electrical assembly (optical engine), according to the present invention, includes an apparatus for damping and monitoring emissions from VCSELs according to the present invention. FIG. 3 also represents a cross-sectional view of an apparatus for damping and monitoring emissions from VCSELs, according to a first embodiment of the present invention.

The apparatus, according to the first embodiment of the present invention, comprises: a glass substrate 116, an array of four damping layers 112, an array of four pairs of electrodes, an array of four VCSELs, a polymer layer 118, and underfill 120. The glass substrate 116, the array of damping layers 112, the array of pairs of electrodes, and the polymer layer 118 form an optical carrier 101, on which the array of VCSELs is mounted. Typically, the array of VCSELs is arranged in an extra component 103, which is fixed on the optical carrier 101 by means of underfill 120.

Each VCSEL of the array of VCSELs 114 is adapted to receive an electric driver signal from an associated driver and to convert the received electric driver signal into an optical signal, by outputting a laser emission corresponding to the electric driver signal. In the apparatus of FIG. 3, the propagation direction of the laser emission of each VCSEL of the array of VCSELs 114 is downwards, perpendicular to the glass substrate 116. The propagation direction of the laser emission does not have to be perpendicular to the glass substrate 116, but can also be inclined/oblique relative to the (light incident surface of the) glass substrate 116.

Each damping layer of the array of damping layers 112 is provided on the glass substrate 116. The array of VCSELs 114, the array of damping layers 112 and the glass substrate are arranged in such a way that the laser emission of each VCSEL of the array of VCSELs 114 propagates/traverses the respective damping layer of the array of damping layers 112 and the glass substrate 116. In the apparatus shown in FIG. 3, the upper and lower surface of each damping layer 112 is (substantially) perpendicular to the propagation direction of the laser emission of the respective VCSEL. The area of the damping layer 112 is greater than the cross-sectional area of the laser beam of the respective VCSEL 114. Also, each damping layer 112 is arranged between the respective VCSEL 114 and the glass substrate 116, so that the laser emission emerging from the respective VCSEL traverses first the damping layer 112 and then the glass substrate 116.

Furthermore, each damping layer of the array of damping layers 112 is adapted to decrease/attenuate/damp the power level of the laser emission of its respective VCSEL 114 by absorption. Specifically, each damping layer 112 attenuates the power level of a laser emission that is incident on the upper surface of the damping layer 112, by a predetermined amount, so that the power level of the laser emission exiting the lower surface of each damping layer 112 meets eye safety limits. The predetermined amount is, for example, 10% or more. As a result, the power level of the laser emission emerging the lower surface of the glass substrate 116 is sufficiently lowered compared to the power level of the laser emission emerging the output of the VCSEL, so that the laser emission emerging the lower surface of the glass substrate 116 does not pose a danger for a human being, particularly an eye damage. In other words, the power level of the laser emission emerging (the lower surface of) the glass substrate 116 does not exceed a predetermined power level, wherein the predetermined power level is consistent with eye safety limits.

The glass substrate 116 usually shows a very low absorption coefficient for the laser emission. Therefore, the glass substrate 116 is considered to be (substantially) transparent to the laser emission of the VCSELs 114. Also, the present invention is not limited to a glass substrate, but may include, instead of the glass substrate 116, any substrate showing a low, preferably insignificant, absorption/attenuation coefficient for the laser emission.

According to the present invention, the damping layers of the array of damping layers 112 are isolated, particularly electrically isolated, from each other; and each damping layer of the array of damping layers 112 is photosensitive to the laser emission of its respective VCSEL 114. This means that a laser emission passing through a damping layer 112 generates electron-hole pairs, i.e. free charge carriers, in the respective damping layer, thereby altering its electrical conductivity. The number of electron-hole pairs generated in the damping layer 112, and thus its electrical conductivity, corresponds to the power level of the laser emission that is incident to the upper surface of the damping layer. The electrical conductivity of the damping layer 112 increases when the power level of the Incident laser emission increases. For example, the damping layer 112 is (or acts as) a photoresistor.

In the apparatus for damping and monitoring emissions from VCSELs, according to the present invention, any/each damping layer of the array of damping layers 112 includes, for example, silicon—preferentially amorphous silicon, because amorphous silicon can be easily deposited on the glass substrate, e.g. by RF-sputtering, and has lower scattering losses than poly-crystal silicon. Mono-crystal silicon can also be used for the damping layer 112, especially if the optical carrier is build of silicon wafer.

Also, according to the present invention, the electrodes (110, 111) of each pair of electrodes of the array of pairs of electrodes are in direct contact with a respective damping layer 112, so that the electrodes (110, 111) can collect the free charge carriers induced by the laser emission that passes through the respective damping layer 112. Furthermore, each pair of electrodes is adapted to sense the change of the electrical conductivity of the respective damping layer 112, when a laser emission passes through the respective damping layer, and to output an electric signal corresponding to the power level of the laser emission that is incident onto the respective damping layer 112. This electric signal is suitable for monitoring the power level of the laser emission, for instance, by the driver IC 102 or any other device. Any/Each pair of electrodes of the array of pairs of electrodes are connectable to respective inputs of the driver IC 102 or any other device.

Transparent electrodes 110 and 111 (for instance, formed of indium tin oxide, ITO) are advantageous for the present invention, if the electrodes 110 and 111 of a damping layer 112 are arranged close to each other, so that the laser emission passing through the respective damping layer crosses one or both electrodes 110 and 111.

In the apparatus according to the first embodiment, shown in FIG. 3, the electrodes (110, 111) of each pair of electrodes and a part (preferably the middle part) of each damping layer 112 are deposited, preferably directly, on the upper surface of the glass substrate 116; and another part (preferably a peripheral part) of each damping layer 112 is deposited, preferably directly, on the electrodes 110 and 111 of the pair of electrodes which directly contact the respective damping layer 112. The (layer) structure of the apparatus according to the first embodiment also becomes evident from FIG. 4.

Figure 4:
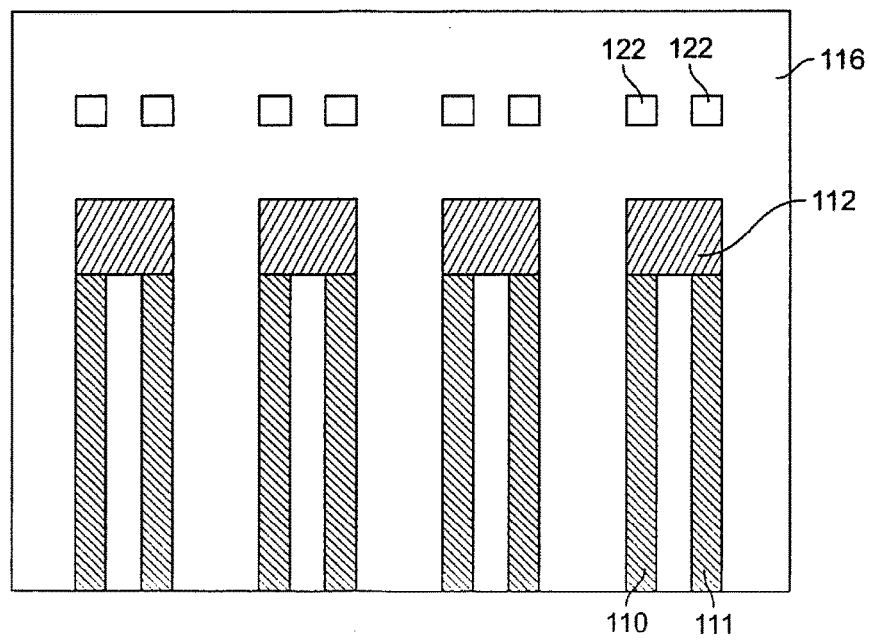
FIG. 4 shows a plan view on the surface of the glass substrate of the apparatus according to the present invention, including contact areas for the VCSELs, the layers for damping and monitoring the laser emissions, and the electrodes for collecting the electric charges generated by the laser emission in respective layers for damping and monitoring the laser emissions.

FIG. 4 shows a plan view of the optical carrier which does not have the polymer layer 118. An apparatus for damping and monitoring emissions from VCSELs including the optical carrier shown in FIG. 4 is also in accordance with the first embodiment of the present invention.

FIG. 4 shows the damping layers of the array of damping layers 112, their associated pair of electrodes (100, 111) of the array of pairs of electrodes, and an array of contact areas 122 for contacting/connecting inputs of the VCSELs of the array of VCSELs to respective outputs of the driver IC 102 (the VCSELs and the driver IC are not shown in FIG. 4). This figure clearly shows that the damping layers of the array of damping layers 112 are isolated from each other. It s further evident from FIGS. 3 and 4 that each electrode of each pair of electrodes includes a layer arranged between a peripheral/marginal portion of its associated damping layer 112 and the glass substrate 116, and that this peripheral portion of the damping layer 112 is deposited, preferably directly, on the layer of the respective electrode. This (layer) structure is in accordance with the present invention, and has the advantage that it can be easily and cost-effectively manufactured.

However, it is not mandatory for the first embodiment of the present invention that a part of the damping layer is deposited on the electrodes contacting the respective damping layer. It is sufficient that the electrodes contact lateral faces of the respective damping layer.

Also, it is not mandatory for the first embodiment of the present invention that the damping layers and the pairs of electrodes are provided between the VCSELs and the glass substrate. The effect of damping and monitoring the laser emission of the VCSEL can be achieved also if the damping layers and their associated pairs of electrodes can be provided/deposited on the lower surface of the glass substrate, i.e. the surface being more distant from the respective VCSEL FIGS. 3 and 4 show an embodiment of the present invention including four cells/channels for converting an electrical driving signal into an optical signal. However, the present invention is also applicable to an apparatus for damping and monitoring emissions from a laser device, including any plurality of cells/channels. Also, the present invention is applicable to an embodiment including a single cell/channel.

Figure 5:
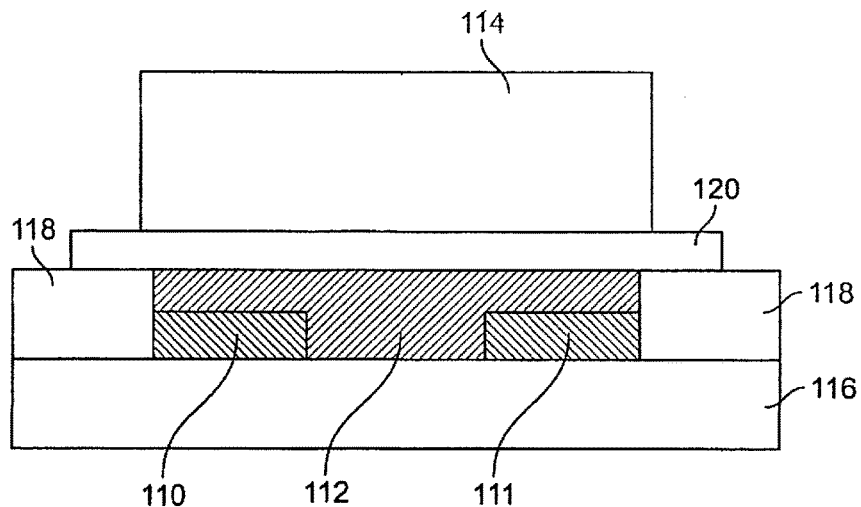
FIG. 5 shows a cross sectional view of an apparatus for damping and monitoring emissions from a VCSEL according to a second embodiment of the present invention.

FIG. 5 shows a cross-sectional view of a single cell of the array shown in FIG. 3. This cell represents a second embodiment of the present invention. For convenience, components (or layers) in FIG. 5 that are similar or identical to corresponding components (or layers) in FIGS. 3 and 4 are assigned the same reference numbers.

The apparatus, according to the second embodiment of the present invention, comprises: a glass substrate 116, a damping layer 112, a pair of electrodes, a VCSEL, a polymer layer 118, and underfill 120. The glass substrate 116, the damping layer 112, the pair of electrodes, and the polymer layer 118 form an optical carrier, on which the VCSEL is mounted. Typically, the VCSEL is arranged in an extra component, which is fixed on the optical carrier by means of underfill 120.

The VCSEL 114 is adapted to receive an electric driver signal from an associated driver and to convert the received electric driver signal into an optical signal, by outputting a laser emission corresponding to the electric driver signal. In the apparatus of FIG. 5, the propagation direction of the laser emission of the VCSEL 114 is downwards, perpendicular to the glass substrate 116. However, in the present invention, the propagation direction of the laser emission does not have to be perpendicular to the glass substrate 116. The propagation direction of the laser emission can also be inclined relative to the (light incident surface of the) glass substrate 116.

The damping layer 112 corresponding to the VCSEL 114 is arranged in the propagation direction of the laser emission of the VCSEL. Preferably, the cross-sectional area of the damping layer 112 is (substantially) perpendicular to the propagation direction of the laser emission of the VCSEL, and/or the cross-sectional area of the damping layer 112 is equal to, or greater than, the cross-sectional area of the laser emission of the VCSEL 114. In the embodiment shown in FIG. 5, the damping layer 112 is arranged between the VCSEL 114 and the glass substrate 116, so that the laser emission emerging from the VCSEL is incident on the upper surface of the damping layer 112.

The damping layer 112 is adapted to decrease/attenuate/damp the power level of the laser emission of the VCSEL 114 by absorption. For instance, the damping layer 112 is adapted to attenuate the power level of the laser emission that is incident on the upper surface of the damping layer 112, by a predetermined amount, so that the power level of the laser emission exiting the lower surface of the damping layer 112 meets eye safety limits. The predetermined amount is, for example, 10% or more. As the glass substrate 116 usually has a non-zero absorption coefficient for the laser emission (though this is very low) and the laser emission emerging the VCSEL is subjected to attenuation/absorption by the damping layer 112 and to absorption by the glass substrate 116, it is sufficient for the present invention (including both the first and second embodiment) that the damping layer 112 is adapted such that the combined absorption by both the damping layer 112 and the glass substrate 116 attenuates the power level of the laser emission emerging the VCSEL to a predetermined power level which is consistent with eye safety limits. Accordingly, the power level of the laser emission emerging the glass substrate 116 is limited to the predetermined power level.

According to the present invention, the power level of the laser emission emerging the lower surface of the glass substrate 116 is sufficiently lowered compared to the power level of the laser emission emerging the output of the VCSEL, so that the laser emission emerging the lower surface of the glass substrate 116 does not pose a danger for a human being, particularly for eye damage.

However, the present invention is not limited to apparatuses/applications for damping and monitoring emissions from a laser device, wherein the power level of the laser emission leaving the glass substrate/damping layer is limited to a (predetermined) level that is consistent with eye safety limits, but subsumes/covers also apparatuses/applications, wherein the power level of the laser emission leaving the glass substrate/damping layer is limited to any (predetermined) desired level.

According to the present invention, the damping layer 112 is photosensitive to the laser emission of the VCSEL 114. The electrical conductivity of the damping layer 112 corresponds to the power level of the laser emission that s incident to the upper surface of the damping layer. For example, the damping layer 112 is a photoresistor. The damping layer 112 includes silicon, preferably amorphous silicon. Mono-crystal silicon can also be used for the damping layer 112, especially if the optical carrier is build of silicon wafer.

Also, according to the present invention, the electrodes (110, 111) of the pair of electrodes are in direct contact with the damping layer 112, so that the electrodes (110, 111) can collect the free charge carriers induced by the laser emission that passes through the damping layer 112. Furthermore, the pair of electrodes is adapted to sense the change of the electrical conductivity of the damping layer 112, when a laser emission passes through the damping layer, and to output an electric signal corresponding to the power level of the laser emission that is incident onto the damping layer 112. This signal can be used for monitoring the power level of the laser emission.

If the electrodes 110 and 111 are arranged so close to each other that the laser emission passing through the damping layer 112 crosses/Intersects one or both electrodes (110, 111), it is advantageous for the present invention that the electrodes 110 and 111 are transparent, for instance, formed of indium tin oxide (ITO).

In the apparatus, according to the second embodiment, the electrodes 110 and 111 and a part (preferably the middle part) of the damping layer 112 are deposited, preferably directly, on the upper surface of the glass substrate 116. The electrode 110 includes a layer arranged between a first portion of the damping layer 112 and the glass substrate 116, and the first portion of the damping layer 112 is deposited (preferably directly) on the layer of the electrode 110. The electrode 111 includes a layer arranged between a second portion of the damping layer 112 and the glass substrate 116, and the second portion of the damping layer 112 is deposited (preferably directly) on the layer of the electrode 111. Preferably, the first portion and/or the second portion of the first damping layer 112 are peripheral regions of the damping layer 112.

It is not mandatory for the second embodiment of the present invention that a part of the damping layer is deposited on the electrodes contacting the damping layer. It is sufficient that the electrodes contact lateral faces of the damping layer.

Also, it is not mandatory for the second embodiment of the present invention that the damping layer and the pair of electrodes are provided between the VCSEL and the glass substrate. The effect of damping and monitoring the laser emission of the VCSEL can be achieved also if the damping layer and the pair of electrodes can be provided/deposited on the lower surface of the glass substrate, i.e. the surface being more distant from the VCSEL.

Figure 6:
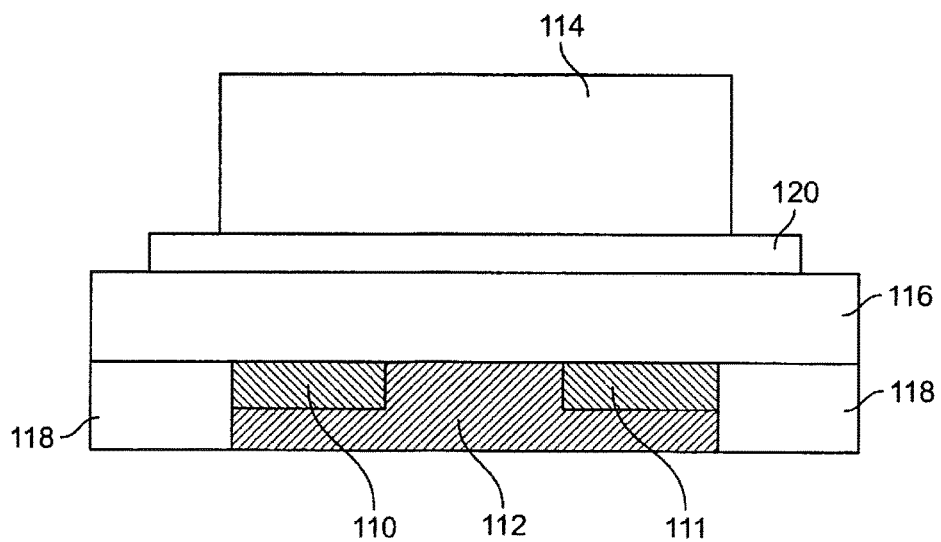
FIG. 6 shows a cross sectional view of an apparatus for damping and monitoring emissions from a VCSEL according to a third embodiment of the present invention.

FIG. 6 shows a cross sectional view of an apparatus for damping and monitoring emissions from a VCSEL according to a third embodiment of the present invention. This embodiment differs from the first and second embodiment in that: the substrate 116 is arranged between the VCSEL 114 and the damping layer 112, and the pair of electrodes, 110 and 111, is arranged below/on the lower surface of the substrate 116.

In the third embodiment of the present invention, the laser emission of the VCSEL 114 enters the substrate 116 at the upper surface thereof, traverses the substrate 116, leaves the substrate 116 at the lower surface thereof, thereafter enters the damping layer 112 at its (upper) surface contacting the lower surface of the substrate 116, traverses the damping layer 112, and leaves the damping layer 112 at its lower surface opposing the upper surface of the damping layer 112. However, in the first and second embodiment, the laser emission of the VCSEL 114 enters the damping layer 112 (at the upper surface thereof), traverses the damping layer 112, leaves the damping layer 112 (at the lower surface thereof), thereafter enters the substrate 116 at its (upper) surface contacting the lower surface of the damping layer 112, traverses the substrate 116, and leaves the substrate 116 at its lower surface opposing the upper surface of the substrate 116.

Figure 7A:
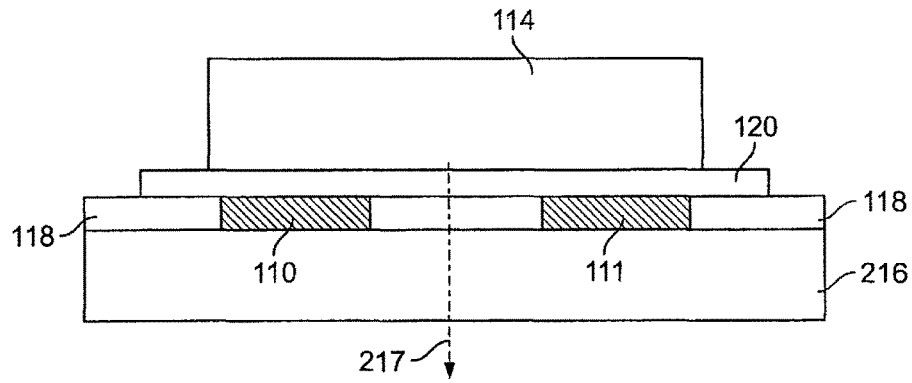
FIGS. 7a, 7b and 7c show (a cross sectional view of) examples of an apparatus for damping and monitoring emissions from a VCSEL according to a fourth embodiment of the present invention.
Figure 7B:
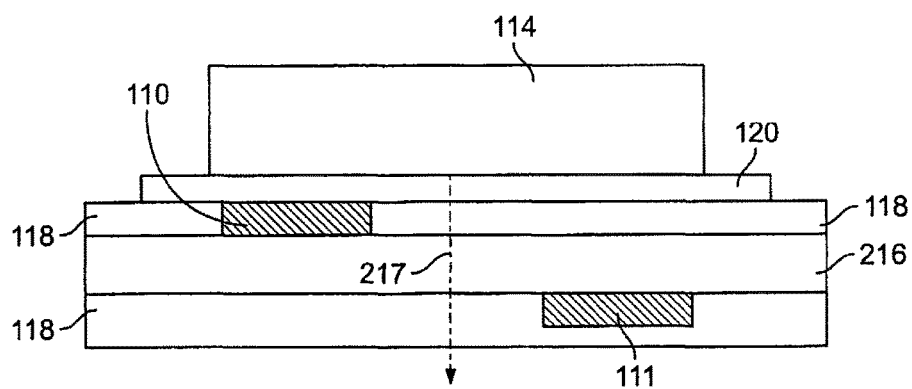
Figure 7C:
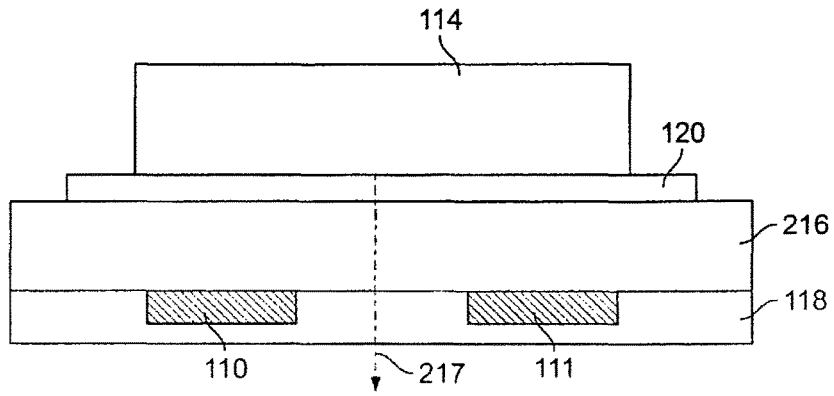

The apparatus for damping and monitoring emissions from a VCSEL according to the third embodiment may comprise two or more cells/channels, each having a configuration as shown in FIG. 6. Specifically, the third embodiment may further comprise: another (second) VCSEL arranged above the upper surface of the substrate 116; another (second) damping layer which is isolated from the (first) damping layer and arranged below the substrate 116, so that at least a part of the other damping layer is deposited on the lower surface of the substrate 116; and another (second) pair of electrodes arranged on/below the lower surface of the substrate 116. The other damping layer is photosensitive to the laser emission of the other VCSEL and is adapted to decrease the power level of the laser emission of the other VCSEL to the desired level. Each electrode of the other pair of electrodes is in electrical contact with the other damping layer so as to collect free electric charges induced in the other damping layer by the laser emission of the other VCSEL. The other pair of electrodes is adapted to output another (second) signal corresponding to the power level of the laser emission of the other VCSEL FIGS. 7a, 7b and 7c show an apparatus for damping and monitoring emissions from a VCSEL according to a fourth embodiment of the present invention. This embodiment differs from the first, second and third embodiment in that the substrate 216 is photosensitive to the laser emission of the VCSEL(s); the substrate 216 is adapted to decrease the power level of the laser emission of the VCSEL(s) by absorption, to the (predetermined) desired level; and the pair of electrodes, 110 and 111, needs to directly contact the upper surface and/or lower surface of the substrate 216 in order to collect the free electric charges induced by the laser emission of the VCSEL.

The fourth embodiment of the present invention comprises: a VCSEL 114 for generating a laser emission; a (carrier) substrate 216 that is at least partially transparent to the laser emission of the VCSEL 114 and is adapted to carry the VCSEL 114 and eventually other electronic components; a pair of electrodes, 110 and 111, each of which being in direct contact with a surface of the substrate 216. The substrate 216 has a first surface and a second surface. Preferably, these surfaces are parallel and opposite to each other. The VCSEL 114 is arranged above the first (upper) surface of the substrate 216, so that the laser emission of the VCSEL 114 enters the substrate 216 at its first surface, traverses a region of the substrate 216 extending between the first surface and the second (lower) surface of the substrate 216, in the direction indicated by array 217, and leaves the substrate 216 at its second surface.

According to the fourth embodiment, the substrate 216 is photosensitive to the laser emission of the VCSEL 114. Therefore, the laser emission of the VCSEL 114 generates free electric charges in the region around/along the propagation direction 217, when passing/propagating through the substrate 216. However, the substrate 216 is (substantially) an electrical insulator in those regions where no laser emission is present. The amount of free charges created in the region around/along the propagation direction 217 corresponds to the power level of the laser emission of the VCSEL 114. Photoconductive polymers, for instance, a polymer based on N-Vinylcarbazole, can be used as material for the substrate 216.

Furthermore, the substrate 216 is adapted to decrease the power level of the laser emission of the VCSEL 114 by absorption, to the predetermined (desired level). This absorption occurs in the substrate 216, in the region along the propagation direction 217, while the laser emission propagates from the first (upper) surface of the substrate 216 to the second (lower) surface of the substrate 216. The term 'absorption' used here relates to both the deposition of radiation energy into (the medium of) the substrate and scattering processes in (the medium of) the substrate, deflecting the radiation from their initial propagation direction. Both energy deposition into (the medium of) the substrate and scattering processes attenuate the Intensity of the laser emission (measured in W/m$^2$) propagating through the substrate 216.

Therefore, in accordance with the fourth embodiment of the present invention, the transmission factor/transmittance of the substrate 216, which is the ratio between the Intensity (in W/m$^2$) of the laser emission entering the substrate 216 at its first (upper) surface and the intensity (in W/m$^2$) of the laser emission leaving the substrate 216 at its second (lower) surface, is selected such that the intensity/power level of the laser emission leaving the substrate 216 is lower than the desired level (taking into consideration that the substrate 216 has a sufficient mechanical strength for carrying the VCSEL (s) and eventually the other electronic components). For instance, the desired level is an Intensity/power level of the laser emission of the VCSEL 114 that is consistent with eye safety limits.

According to the fourth embodiment, each electrode of the pair of electrodes, 110 and 111, is (directly) deposited on the upper surface and/or lower surface of the substrate 216, so as to be able to collect free electric charges induced by the laser emission of the VCSEL in the region around/along the propagation direction 217 of the substrate 216. Furthermore, the pair of electrodes, 110 and 111, is adapted to output an electric signal corresponding to the intensity/power level of the laser emission of the VCSEL 114, based on the collected free electric charges.

FIG. 7a shows a first example of the fourth embodiment, wherein the pair of electrodes, 110 and 111, is arranged between the VCSEL 114 and the substrate 216. Each electrode of the pair of electrodes, 110 and 111, is (directly) deposited on the first (upper) surface of the substrate 216. FIG. 7b shows a second example of the fourth embodiment, wherein the electrodes of the pair of electrodes, 110 and 111, are arranged on different/opposing surfaces of the substrate 216. For instance, the electrode 110 is (directly) deposited on the upper surface of the substrate 216, and the electrode 111 is (directly) deposited on the lower surface of the substrate 216. FIG. 7c shows a third example of the fourth embodiment, wherein the pair of electrodes, 110 and 111, is arranged on the surface of the substrate 216 being more distant from the VCSEL 114. Specifically, each electrode of the pair of electrodes, 110 and 111, is (directly) deposited on the lower surface of the substrate 216.

In the first, second and third example of the fourth embodiment, each electrode of the pair of electrodes, 110 and 111, is in contact with the substrate 216 and positioned relative to the propagation direction 217 of the laser mission of the VCSEL 114, so that the pair of electrodes, 110 and 111, is able to collect free charges induced by the laser emission propagating along the direction 217.

The apparatus for damping and monitoring emissions from a VCSEL according to the fourth embodiment may comprise two or more cells/channels, each having a configuration as shown in any of FIGS. 7a, 7b and 7c. Specifically, the fourth embodiment may further comprise: another (second) VCSEL arranged above the upper surface of the substrate 216; and another (second) pair of electrodes arranged on the upper surface and/or lower surface of the substrate 216. The substrate 216 also s photosensitive to the laser emission of the other VCSEL and adapted to decrease the power level of the laser emission of the other VCSEL by absorption, to the desired level. The other pair of electrodes is in (electrical) contact with the substrate 216 so as to collect free electric charges induced by the laser emission of the other VCSEL, and adapted to output another electrical signal corresponding to the power level of the laser emission of the other VCSEL. The first and second channels are separated by regions of the substrate where no laser emission will propagate. Consequently, these regions will have a permanent electrical resistance corresponding to an electrical insulator, irrespective of whether laser emission propagates along a channel or not. As the regions surrounding a channel are electrical insulators, the electric signal output by the pair of electrodes corresponding to one channel is not influenced by the laser emission of the VCSEL corresponding to another channel.

In FIGS. 6, 7a, 7b and 7c, the reference numerals 118 and 120 represent a polymer layer and an under-fill layer, respectively.

An opto-electrical assembly (optical engine) according to the present invention comprises an apparatus according to the first or second embodiment, terminals 122 for connecting the VCSEL (or the array of VCSELs), and terminals for connecting electronic components, preferably a driver 102 for driving the VCSEL (or the array of VCSELs). The opto-electrical assembly according to the present invention can further comprise a polymer layer 118 deposited in an area of the upper surface of the glass substrate 116 which does not include a damping layer of the array of damping layers 112 or a contact area (terminal) of the array of contact areas 122. Furthermore, the opto-electrical assembly according to the present invention can comprise an underfill 120 between a VCSEL of the array of VCSELs 114 and its corresponding damping layer 112.

The present invention is not limited only to VCSELs, but is also applicable to any laser devices emitting a laser emission; for instance, any type of laser diodes or optical fibers outputting a laser emission. The present invention is also applicable to light emitting diodes (LEDs).

The apparatus for damping and monitoring emissions from a laser device, according to the present invention, performs both functions, the damping of the laser emission to a power level which is consistent with eye safety limits and the monitoring of the power level of the laser emission, by means of one and the same layer. Accordingly, the apparatus for damping and monitoring emissions from a laser device, according to the present invention, can be easily and cost-efficiently manufactured.

| Reference Numerals | |
|---|---|
| Reference Numeral | Description |
| 100 | Opto-electrical assembly (optical engine) |
| 101 | Optical carrier (layer structure) |
| 102 | Driver IC |
| 103 | Array of VCSELs |
| 104 | Array of photodiodes |
| 105 | IC including transimpedance amplifiers (TIA) |
| 106 | Input terminals of driver IC |
| 110, 111 | Electrodes |
| 112 | Damping and monitoring layer |
| 114 | Vertical cavity surface emitting laser (VCSEL) |
| 116 | Glass substrate |
| 118 | Polymer layer |
| 120 | Under-fill layer |
| 122 | Contact areas for VCSELs |
| 131 | VCSEL array layer |
| 132 | Array of VCSELs |
| 133 | Contact areas on the VCSEL array layer |
| 134 | Layer of flex circuit |
| 135 | Contact areas on the layer of flex circuit |
| 136 | Amorphous silicon layer |
| 137 | Glass substrate |
| 139 | Array of pn detectors |
| 140 | Contact areas on the amorphous silicon layer |
| 216 | Substrate adapted for damping and monitoring |
| 217 | Propagation direction of the laser emission of a VCSEL |

What is claimed is:

1. An apparatus, comprising:
a substrate that is at least partially transparent;
a first light emitting device, including a vertical cavity surface emitting laser (VCSEL), for generating light emission;
a first damping layer, including amorphous silicon, for decreasing a power level of the light emission of the first light emitting device by absorption, to a desired level,
wherein at least a part of the first damping layer is deposited on a surface of the substrate, and
wherein the first damping layer is photosensitive to the light emission of the first light emitting device; and
a first pair of electrodes, each of which being in direct contact with the first damping layer, for outputting a first electric signal corresponding to the power level of the light emission of the first light emitting device,
wherein a first electrode of the first pair of electrodes includes a layer arranged between a first portion of the first damping layer and the substrate, and
wherein a second electrode of the first pair of electrodes includes a layer arranged between a second portion of the first damping layer and the substrate.

2. The apparatus according to claim 1, wherein the first damping layer is arranged between the first light emitting device and the substrate.

3. The apparatus according to claim 1, wherein the substrate is arranged between the first light emitting device and the first damping layer.

4. The apparatus according to claim 1, wherein the first electrode of the first pair of electrodes is deposited on the surface of the substrate, and/or
the second electrode of the first pair of electrodes is deposited on the surface of the substrate.

5. The apparatus according to claim 4, wherein first portion of the first damping layer is deposited on the layer of the first electrode of the first pair of electrodes;
the second portion of the first damping layer is deposited on the layer of the second electrode of the first pair of electrodes; and
the first portion and/or the second portion of the first damping layer are peripheral regions of the first damping layer.

6. The apparatus according to claim 4, wherein an electrode of the first pair of electrodes includes indium tin oxide.

7. The apparatus according to claim 1, further comprising:
a second light emitting device, including a vertical cavity surface emitting laser (VCSEL), for generating light emission;
a second damping layer, including amorphous silicon, for decreasing the power level of the light emission of the second light emitting device to a desired level,
wherein at least a part of the second damping layer is deposited on the surface of the substrate,
the second damping layer is photosensitive to the light emission of the second light emitting device, and
the second damping layer is isolated from the first damping layer; and
a second pair of electrodes, each of which being in direct contact with the second damping layer, for outputting a second electric signal corresponding to the power level of the light emission of the second light emitting device.

8. An apparatus, comprising:
a substrate that is at least partially transparent;

a light emitting device, including a vertical cavity surface emitting laser (VCSEL), for generating light emission;

a damping layer, including amorphous silicon, for decreasing a power level of the light emission of the light emitting device by absorption, to a desired level; and a pair of electrodes, each of which being in direct contact with a surface of the substrate, wherein the light emission enters the substrate at a first surface thereof, traverses a region of the substrate extending between the first surface and a second surface of the substrate, and leaves the substrate at the second surface thereof, wherein the first surface and the second surface of the substrate are opposite to each other, wherein the substrate is photosensitive to the light emission of the light emitting device and is adapted to decrease a power level of the light emission of the light emitting device by absorption, to a desired level, wherein the pair of electrodes is adapted to output an electric signal corresponding to the power level of the light emission of the light emitting device, based on free electric charges induced by the light emission in the region of the substrate, wherein a first electrode of the pair of electrodes includes a layer arranged between a first portion of the damping layer and the substrate, and wherein a second electrode of the pair of electrodes includes a layer arranged between a second portion of the damping layer and the substrate.

9. The apparatus according to claim 8, wherein both electrodes of the pair of electrodes are arranged on either the first surface or the second surface; or the first electrode of the pair of electrodes is arranged on the first surface and the second electrode of the pair of electrodes is arranged on the second surface.

10. An apparatus, comprising:

a substrate that is at least partially transparent, including a glass material;

a plurality of light emitting devices, including vertical cavity surface emitting lasers (VCSELs), each light emitting device of the plurality of light emitting devices is adapted to generate light emission;

a plurality of damping layers, including amorphous silicon, each damping layer of the plurality of damping layers being associated with a respective light emitting device of the plurality of light emitting devices, wherein each damping layer of the plurality of damping layers is arranged in propagation direction of the light emission of its associated light emitting device of the plurality of light emitting devices, wherein each damping layer of the plurality of damping layers is adapted to decrease a power level of the light emission of its associated light emitting device of the plurality of light emitting devices by absorption, to a desired level, wherein at least a part of each damping layer of the plurality of damping layers is deposited on a surface of the substrate, wherein each damping layer of the plurality of damping layers is photosensitive to the light emission of its associated light emitting device of the plurality of light emitting devices, and wherein the damping layers of the plurality of damping layers are isolated from each other; and a plurality of pairs of electrodes, each pair of electrodes of the plurality of pairs of electrodes is associated with a respective damping layer of the plurality of damping layers and is associated with the light emitting device of the plurality of light emitting devices which is associated with the respective damping layer, wherein each electrode of each pair of electrodes of the plurality of pairs of electrodes is in direct contact with the damping layer of the plurality of damping layers which is associated with the respective pair of electrodes, wherein each pair of electrodes of the plurality of pairs of electrodes is adapted to output an electric signal corresponding to the power level of the light emission of its associated light emitting device of the plurality of light emitting devices, wherein a first electrode of each pair of electrodes of the plurality of pairs of electrodes includes a layer arranged between a first portion of its associated damping layer of the plurality of damping layers and the substrate, and wherein a second electrode of each pair of electrodes of the plurality of pairs of electrodes includes a layer arranged between a second portion of its associated damping layer of the plurality of damping layers and the substrate.

11. The apparatus according to claim 10, wherein each damping layer of the plurality of damping layers is arranged between its associated light emitting device of the plurality of light emitting devices and the substrate.

12. The apparatus according to claim 10, wherein:

the first electrode of each pair of electrodes of the plurality of pairs of electrodes is deposited on the surface of the substrate, the first portion of its associated damping layer of the plurality of damping layers is deposited on the layer of the first electrode of the respective pair of electrodes of the plurality of pairs of electrodes, the second electrode of each pair of electrodes of the plurality of pairs of electrodes is deposited on the surface of the substrate, the second portion of its associated damping layer of the plurality of damping layers is deposited on the layer of the second electrode of the respective pair of electrodes of the plurality of pairs of electrodes, and the first portion and the second portion of each damping layer of the plurality of damping layers are peripheral regions of the respective damping layer.

13. The apparatus according to claim 10, further comprising:

terminals for connecting each light emitting device of the plurality of light emitting devices of the apparatus, and terminals for connecting electronic components, at least one of the electronic component including a driver for driving each light emitting device of the plurality of light emitting devices of the apparatus.

14. The apparatus according to claim 13, further comprising a polymer layer deposited in an area of the surface of the substrate which does not include a damping layer of the plurality of damping layers of the apparatus or a terminal.

15. The apparatus according to claim 14, further comprising an underfill between each light emitting device of the plurality of light emitting devices of the apparatus and its corresponding damping layer of the plurality of damping layers.

16. The apparatus according to claim 10, wherein the plurality of damping layers attenuates the power level by a predetermined amount such that the power level of the light emission meets eye safety limits upon exiting a lower surface of the substrate opposite an upper surface of the substrate that includes the deposited plurality of damping layers.

17. The apparatus according to claim 10, wherein the light emission, upon passing through the plurality of damping layers, generates electron-hole pairs altering an electrical conductivity of the plurality of damping layers.

18. The apparatus according to claim 17, wherein the electrical conductivity of the plurality of damping layers corresponds to the power level of the light emission that is incident to an emission-entry surface of each damping layer of the plurality of damping layers, the electrical conductivity of the plurality of damping layers adapted to increase in response to an increase in the power level of the light emission incident to the emission-entry surface of each damping layer of the plurality of damping layers.

19. The apparatus according to claim 17, wherein the plurality of pairs of electrodes is adapted to sense a change in the electrical conductivity of the plurality of damping layers.

20. The apparatus according to claim 10, wherein at least a part of each damping layer of the plurality of damping layers is deposited directly on the surface of the substrate.

\* \* \* \* \*